US009716398B2

(12) United States Patent
Lee et al.

(10) Patent No.: US 9,716,398 B2
(45) Date of Patent: Jul. 25, 2017

(54) AUTO CORRECTION DRIVING DEVICE AND WIRELESS CHARGER DRIVING SYSTEM USING THE SAME

(71) Applicant: AMtek SEMICONDUCTOR CO., LTD., New Taipei (TW)

(72) Inventors: Teng-Hui Lee, New Taipei (TW); Chen-Pin Lo, New Taipei (TW); Keng-Yi Wu, New Taipei (TW)

(73) Assignee: Amtek Semiconductor Co., Ltd., New Taipei (TW)

( * ) Notice: Subject to any disclaimer, the term of this patent is extended or adjusted under 35 U.S.C. 154(b) by 539 days.

(21) Appl. No.: 14/483,541

(22) Filed: Sep. 11, 2014

(65) Prior Publication Data
US 2016/0013769 A1   Jan. 14, 2016

(30) Foreign Application Priority Data

Jul. 10, 2014   (TW) .............................. 103123751 A (51) Int. Cl.
| | | |
|---|---|---|
| *H03K 3/00* | (2006.01) | |
| *H02J 7/00* | (2006.01) | |
| *H02J 7/02* | (2016.01) | |
| *H03F 3/45* | (2006.01) | |
| *H03K 5/003* | (2006.01) | |
| *H03K 5/007* | (2006.01) | |

(52) U.S. Cl.
CPC ............ *H02J 7/007* (2013.01); *H02J 7/0077* (2013.01); *H02J 7/025* (2013.01); *H03F 3/45475* (2013.01); *H03F 3/45762* (2013.01); *H03F 2200/375* (2013.01); *H03F 2200/78* (2013.01); *H03F 2203/45048* (2013.01); *H03F 2203/45078* (2013.01); *H03F 2203/45212* (2013.01); *H03F 2203/45588* (2013.01); *H03F 2203/45594* (2013.01); *H03F 2203/45604* (2013.01); *H03K 5/003* (2013.01); *H03K 5/007* (2013.01)

(58) Field of Classification Search
None
See application file for complete search history.

(56) References Cited

U.S. PATENT DOCUMENTS

| | | | | | |
|---|---|---|---|---|---|
| 5,061,900 | A | * | 10/1991 | Vinn ................... | H03F 3/45479 330/259 |
| 6,549,054 | B2 | * | 4/2003 | Ono ...................... | H03F 3/087 327/307 |
| 7,245,169 | B2 | * | 7/2007 | Kishii ................. | H03F 3/45183 327/307 |
| 7,499,687 | B2 | * | 3/2009 | Papathanasiou ..... | H04B 1/0475 455/136 |

(Continued)

*Primary Examiner* — Tuan T Lam
(74) *Attorney, Agent, or Firm* — Muncy, Geissler, Olds & Lowe, P.C.x (57) ABSTRACT

A driving device with correction function is provided herein and utilizes a sensing resistor to detect the variation in an operation amplifier. A signal generated by an offset voltage correction circuit is fed back to the operation amplifier and the offset voltage of the abnormal input in the operation amplifier is corrected to be zero so as to keep the operation amplifier under the best performance condition. The driving device implements in the wireless charger driving system can enhance the accuracy of the current value and can achieve good output performance and better system stability.

16 Claims, 5 Drawing Sheets

(56) References Cited

U.S. PATENT DOCUMENTS

| | | | |
|---|---|---|---|
| 2006/0082487 A1* | 4/2006 | Chiang | H03K 5/003 341/170 |
| 2006/0197575 A1* | 9/2006 | Huang | H03K 5/007 327/307 |
| 2011/0074505 A1* | 3/2011 | Chiang | H03F 3/45475 330/127 |
| 2012/0188009 A1* | 7/2012 | Alexander | H03F 3/45475 330/69 |
| 2013/0285726 A1* | 10/2013 | Roytman | H03K 5/26 327/175 |
| 2015/0171885 A1* | 6/2015 | Juang | H03M 1/06 341/118 |
| 2016/0294331 A1* | 10/2016 | Ivanov | H03F 1/26 |
| 2017/0040985 A1* | 2/2017 | Chen | H03K 5/003 |
| 2017/0047903 A1* | 2/2017 | Price | H03F 3/45071 |

\* cited by examiner

AUTO CORRECTION DRIVING DEVICE AND WIRELESS CHARGER DRIVING SYSTEM USING THE SAME

FIELD OF THE INVENTION

The present invention relates to a field of driving system, and more particularly relates to a driving device with correction function implementing the auto correction method to reset the input offset voltage generated by the operation amplifier to zero so as to keep the operation amplifier under the best performance condition and enhance the accuracy of the output value and achieve good output performance and better system stability.

BACKGROUND OF THE INVENTION ($SW_B$)

In general, the operational amplifier is an important component in many circuits, and can be applied to achieve a lot of different operational functions and widely used in home appliances, industry and other fields.

However, due to limitations of the semiconductor integrated circuit manufacturing process or technology (such as photolithography, etching, or the different package, SMT, IR Reflow and other external factors), those will result in the op amp including non-ideal characteristics in practical operation. Therefore, because of non-ideal factors, the input offset voltage of the op amp will be generated. The input offset voltage will deteriorate the op amp and affect the stability of the overall system in subsequent circuit design.

In conventional art, in order to eliminate the input offset voltage, the wafer test (Chip Circuit Probing) or the final level test is used in One Time Programming (OTP) process for correction, and usually includes an additional external components to achieve the correction. At this point, the chip will affect the input offset voltage again by the external factors so as to worsen the performance of the op amp.

In summary, the effect of the input offset voltage in the op amp because of the process or the physical properties of semiconductors is the problem would like to be solved in the present invention.

SUMMARY OF THE INVENTION

In order to solve the aforementioned problems, an object of the present invention is to provide a driving device with correction function and utilizing an op amp to sense the variation of a sensing resistor. The signal generated by the offset voltage correction circuit of the logic control circuit is used to reset the abnormal offset voltage to zero so as to maintain the performance of the op amp.

In order to solve the aforementioned problem, another object of the present invention is to provide a wireless charger driving system implementing an op amp to sense the variation of the sensing resistor. The signal generated by the offset voltage correction circuit of the logic control circuit is fed back to the op amp to reset the abnormal offset voltage of the op amp to zero so as to maintain the performance of the op amp and enhance the accuracy of the current value and achieve good output performance and better system stability.

According to the objects above, the present invention provides a driving device with correction function, one end thereof connected to a power supply unit and the other end thereof connected to a ground load, and the ground load activated by the power supply unit, and the driving device comprising: an arithmetic processing unit including a first end, a second end and a third end, and the first end and the second end are connected to a sensing resistor between the power supply unit and the ground load, and a voltage different signal is detected at two ends of the sensing resistor, and the third end signal is output a voltage signal; and. an offset voltage correction unit electrically connected to the arithmetic processing unit to correct an offset voltage generated by the arithmetic processing unit, and the offset voltage correction unit including a power activating delay circuit, a comparator and a logic control circuit, wherein a negative input end of the comparator is connected to the reference voltage signal and a positive input end thereof is connected to the output voltage signal of the arithmetic processing unit to form a feedback circuit, the offset voltage is compared to determine to be a positive offset voltage or a negative offset voltage so as to output a control signal to the logic control circuit, when the power is turned on, the power activating delay circuit counts to a predetermined delay time to generate an activating signal to the logic control circuit and the logic control circuit generates an activating signal to trigger the arithmetic processing unit to perform an action, so as to reset the positive voltage or the negative voltage to zero.

According to the objects above, the present invention provides a driving device with correction function, one end thereof connected to a power supply unit and the other end thereof connected to a ground load, and the ground load activated by the power supply unit, and the driving device comprising: an arithmetic processing unit including a first end, a second end and a third end, and the first end and the second end are connected to a sensing resistor between the power supply unit and the ground load, and a voltage different signal is detected at two ends of the sensing resistor to acquire a first sensing voltage signal and a second sensing voltage signal, and the third end signal is represent to an output voltage signal calculated from the first sensing voltage signal, the second voltage signal and the reference voltage signal; and an offset voltage correction unit electrically connected to the arithmetic processing unit to correct an offset voltage generated by the arithmetic processing unit, and the offset voltage correction unit including a power activating delay circuit, a comparator and a logic control circuit, wherein a negative input end of the comparator is connected to the reference voltage signal and a positive input end thereof is connected to the output voltage signal of the arithmetic processing unit to form a feedback circuit, the offset voltage is compared to determine to be a positive offset voltage or a negative offset voltage so as to output a control signal to the logic control circuit, when the power is turned on, the power activating delay circuit counts to a predetermined delay time to generate an activating signal to the logic control circuit and the logic control circuit generates an activating signal to trigger the arithmetic processing unit to perform an action, and a first set control switch signal and a second set control switch signal are generated by the logic control circuit fed back to the arithmetic processing unit so as to reset the positive voltage or the negative voltage to zero.

According to the objects above, the present invention provides a wireless charger driving system including a driving device with correction function and a wireless charging module, and one end of the driving device is connected to a power supply and the other end is connected to a ground load, and the ground load activated by the power supply unit, and the driving device comprising: an arithmetic processing unit including a first end, a second end and a third end, and the first end and the second end are connected to a sensing resistor between the power supply unit and the wireless charging module, and a voltage different signal is detected at two ends of the sensing resistor to acquire a first sensing voltage signal and a second sensing voltage signal, and the third end signal is output a voltage signal calculated from the first sensing voltage signal, the second voltage signal and the reference voltage signal; and an offset voltage correction unit electrically connected to the arithmetic processing unit to correct an offset voltage generated by the arithmetic processing unit, and the offset voltage correction unit including a power activating delay circuit, a comparator and a logic control circuit, wherein a negative input end of the comparator is connected to the reference voltage signal and a positive input end thereof is connected to the output voltage signal of the arithmetic processing unit to form a feedback circuit, the offset voltage is compared to determine to be a positive offset voltage or a negative offset voltage so as to output a control signal to the logic control circuit, when the power is turned on, the power activating delay circuit counts to a predetermined delay time to generate an activating signal to the logic control circuit and the logic control circuit generates an enable signal to trigger the arithmetic processing unit to perform an action, so as to reset the positive voltage or the negative voltage to zero.

DETAILED DESCRIPTION OF THE PREFERRED EMBODIMENTS

Since the operational amplifier (op amp) is affected in manufacture process variation, the package stress, the operating temperature change and other effects, the op amp in the practical operation will include some non-ideal characteristics, such as a voltage deviation, to reduce the operational precision of op amp. The voltage deviation in the present invention is referred to the amount of an abnormal offset voltage. In order to solve this abnormal offset voltage, the present invention discloses a wireless charger driving system implementing a signal generated by a logic control circuit of the offset voltage correction circuit fed back to the op amp so as to reset the abnormal offset voltage to zero. Therefore, the op amp can maintain at best performance and enhance accuracy of the current read by the wireless charger driving system. Since the basic principle and the function of the wireless charging system are well known by the person with ordinary skill in the art, only the features for the present invention are described in detail in the following description. In addition, the drawings for the following description are not made based on the actual size, and the features thereof are to express relevant in the present invention.

Figure 1:
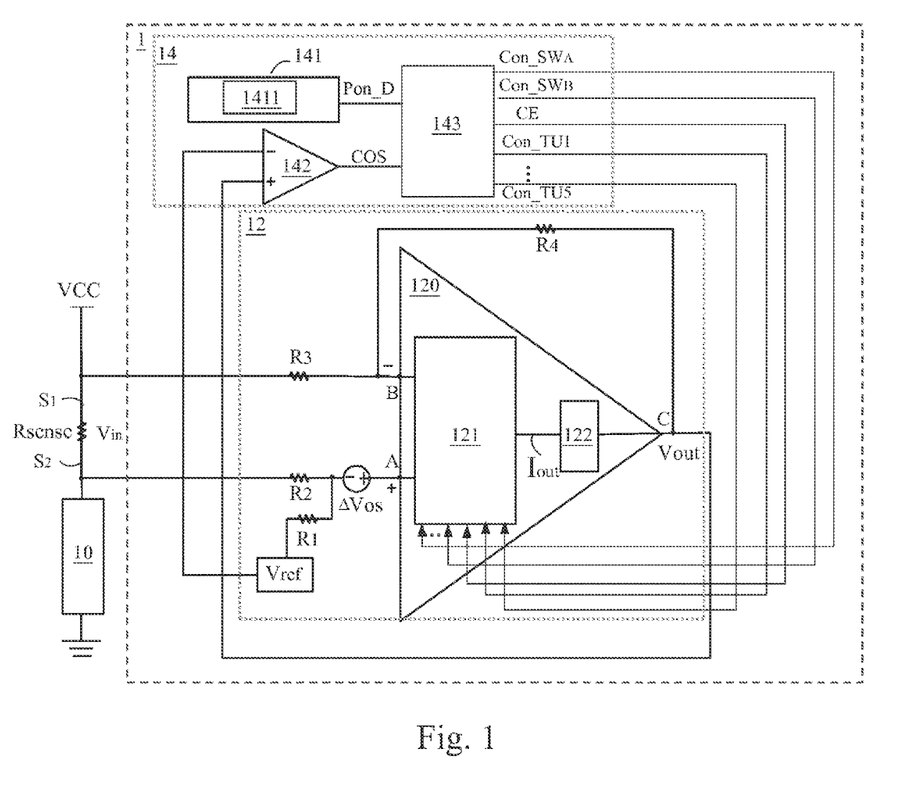
FIG. 1 is a block diagram illustrating a driving device with correction function in the present invention.

Firstly, please refer to FIG. 1, and it is a block diagram illustrating the driving device with correction function in the present invention. As shown in FIG. 1, one end of the driving device 1 with a correction function is coupled to a power supply unit ($V_{cc}$), and the other end thereof is coupled to a ground load 10. The ground load 10 is activated by the power provided from the power supply unit ($V_{cc}$). The driving device with correction function includes an arithmetic processing unit 12 and an offset voltage correction unit 14.

Next, the arithmetic processing unit 12 will be actuated by the power supply unit ($V_{cc}$) in the present invention. The arithmetic processing unit 12 in the present embodiment includes an operational amplifier (op amp) 120, and the op amp 120 includes a positive input end A, a negative input end B and an output end C. The positive input end A receives a reference voltage signal ($V_{ref}$) via a first resistor ($R_1$) and is connected to one end of a sense resistor ($R_{sense}$) via a second resistor ($R_2$). The negative input end B is connected to the other end of the sense resistor ($R_{sense}$) via a third resistor ($R_3$). The output end C is connected to the negative input end B via a fourth resistor ($R_4$). Accordingly, a feedback circuit is formed. In a hypothetical ideal situation, if the reference voltage signal ($V_{ref}$) is connected to the ground (GND), the output voltage of the op amp 120 is zero. However, due to non-ideal factors occurred in the manufacturing process, the output voltage of the op amp 120 is not zero. There will be an unusual amount in the offset voltage ($V_{os}$). Generally, when implementing the op amp 120, the amount of the offset voltage ($V_{os}$) is one of the important parameters to be considered in the op amp 120. In other words, in order to acquire the amount of the offset voltage ($V_{os}$) generated by the op amp 120, two input ends (A, B) of the op amp 120 are respectively connected to two ends of the sensing resistor ($R_{sense}$) via the second resistor ($R_2$) and the third resistor ($R_3$) to detect the input offset voltage at two input ends of the op amp 120. The sense resistor ($R_{sense}$) is disposed between the power supply unit ($V_{cc}$) and the ground load 10. Obviously, a differential voltage signal ($V_{in}$) is obtained by detecting the two ends of the sense resistor ($R_{sense}$), and a first sensing voltage signal S1 and a second voltage sensing signal S2 are obtained in accordance with the differential voltage signal ($V_{in}$). The first sensing voltage signal S1 is inputted to the negative input end B end of the op amp 120 via a third resistor ($R_3$), and the second sensing voltage signal S2 is input to the positive input end A of the op amp 120 via the second resistor ($R_2$). In addition, the op amp 120 further includes a switching module 121 and a conversion circuit 122. Therefore, the switching module 121 can calculate the first sensing voltage signal S1, the second sensing voltage S2 and the reference voltage signal ($V_{ref}$) and output to the conversion circuit 122 so as to convert the voltage to be an output voltage signal ($V_{out}$).

According the aforementioned description of the arithmetic processing unit 12, it is obvious that, during the IC manufacturing process, if photolithography process is not controlled well, the input of the operational amplifier 120 would cause a mismatch to produce an offset voltage ($V_{os}$) and the voltage is equal to the abnormal offset voltage ($V_{os}$).

Thus, by the sense resistor ($R_{sense}$) detecting the abnormal offset voltage ($V_{os}$) generated by the arithmetic processing unit 12, an offset voltage correction unit 14 is used to correct the abnormal offset voltage ($V_{os}$). The offset voltage correction unit 14 in the present invention includes a power activating delay circuit 141, a comparator 142 and a logic control circuit 143. The negative input end of the comparator 142 is connected to a reference voltage signal ($V_{ref}$), and the positive input end thereof is connected to the output voltage signal ($V_{out}$) generated by the arithmetic processing unit 12 to form a feedback circuit for comparing the reference voltage signal ($V_{ref}$) and the output voltage signal ($V_{out}$) so as to determine that the offset voltage is a positive offset voltage ($V_{os+}$) or a negative offset voltage ($V_{os-}$). Thereafter, the output end of the comparator 142 outputs a control signal (COS) to a logic control circuit 143. Moreover, the power activating delay circuit 141 is connected to a counter 1411. In the embodiment of the present invention, the counter 1411 can be disposed inside or outside the offset voltage correction unit 14. In a preferred embodiment, the counter 1411 is disposed inside the offset voltage correction unit 14 in the present invention. The power activating delay circuit 141 counts to a predetermined delay time in accordance with the internal counter 1411, and an activating signal ($P_{on}\_D$) is generated to trigger the logic control circuit 143. Next, the control logic circuit 143 is activated until the operation of the control logic circuit 143 is completed, and the control logic circuit 143 will generate an enable signal (CE) according to the control signal (COS) of the comparator 142. When the enable signal (CE) is a low voltage level (L), the arithmetic processing unit 12 is triggered to perform a corrective action, and first set control switch signals (Con_TU1, Con_TU2, Con_TU3, Con_TU4, Con_TU5) generated by the logic control circuit 143 and second set control switch signals (Con_$SW_A$, Con_$SW_B$) fed back to the switching module 121 of the operational amplifier 120 of the arithmetic processing unit 12. The switching module 121 receives the first set control switch signals (Con_TU1, Con_TU2, Con_TU3, Con_TU4, Con_TU5) to turn on a plurality sets of current control switches, and a converting value corresponding to the current control switches is calculated to obtain a control current, and receives the second set control switch signals (Con_$SW_A$, Con_$SW_B$) to alternatively select a first current flow control switch ($SW_A$) or a second current flow control switch ($SW_B$) (not shown in FIG. 1), which are connected to the current control switches. According to the selection between the first current flow control switch ($SW_A$) and the second current flow control switch ($SW_B$), a corresponding control current is output to correct the abnormal positive offset voltage ($V_{os+}$) or the abnormal negative offset voltage ($V_{os-}$) generated by the op amp 120. Then, an output current is generated and outputted to the conversion circuit 122 to generate an output voltage signal ($V_{out}$). At this point, the output voltage signal further ($V_{out}$) fed back to the comparator 142 to determine the correction amount for the positive offset voltage ($V_{os+}$) or the negative offset voltage ($V_{os-}$) is enough or not. If the correction amount is not enough and the abnormal positive offset voltage ($V_{os+}$) or the abnormal offset voltage ($V_{os-}$) is still existed, the comparator 142 will continue to output the control signal (COS) to drive the control logic circuit 143 to generate the control switch signals (Con_TU1, Con_TU2, Con_TU3, Con_TU4, Con_TU5, Con_$SW_A$, Con_SWB) fed back to the op amp of the arithmetic processing unit 12. At this point, the level of the enable signal (CE) will remain at the low voltage level (L), the abnormal amount of positive offset voltage ($V_{os+}$) or negative offset voltage ($V_{os-}$) generated by the op amp 120 will be calibrated to zero continuously.

Figure 2:
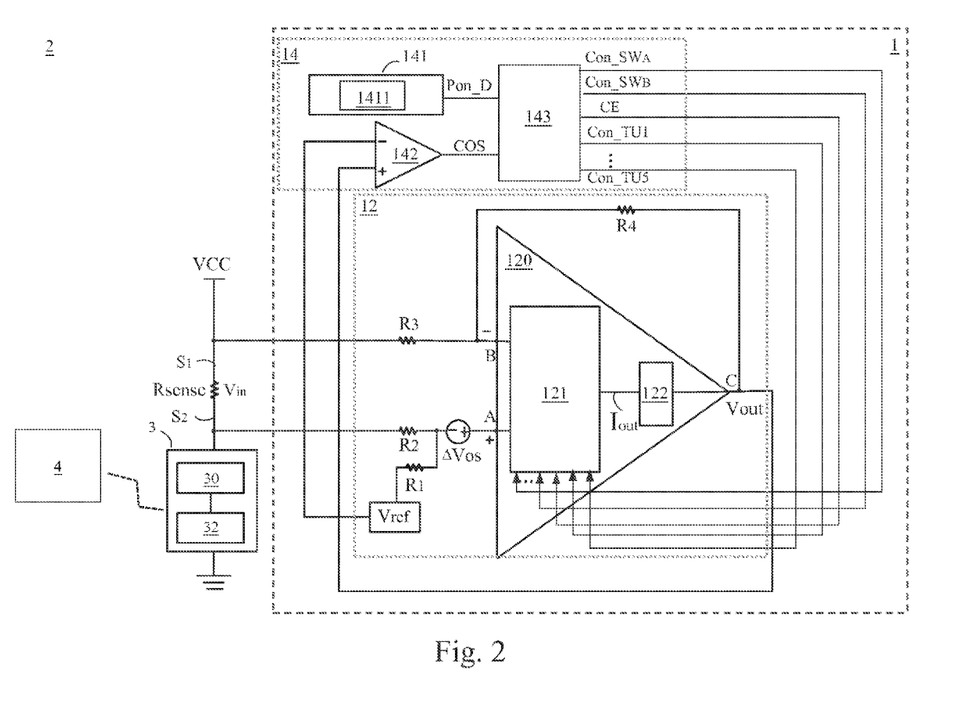
FIG. 2 is a system structural view illustrating a wireless charger driving system in the present invention.

Please refer to FIG. 2, and it is a system structural view illustrating the wireless charger driving system in the present invention. As shown in FIG. 2, the wireless charger driving system includes a driving device 1 with correction function and a wireless charging module 3. The structure of the driving device 1 with correction function is the same as the structure shown in FIG. 1, and is connected to the power supply unit Vcc) and a load. The driving device 1 with correction function includes an arithmetic processing unit 12 and an offset voltage correction unit 14. In one preferred embodiment of the present invention, the structure in FIG. 1 further includes a wireless charging module. In the present embodiment, the wireless charging module 3 further includes a control unit 30 and an output sensing coil 32 connected to the output control unit 30. When the power supply unit 12 ($V_{cc}$) activates the arithmetic processing unit 12, the sensing resistor ($R_{sense}$) connected between the power supply unit ($V_{cc}$) and the load 10 detects the voltage difference signal ($V_{in}$) between two ends of the sensing resistor ($R_{sense}$) to obtain the first sensing voltage signal S1 and the second sensing voltage signal S2. The two input ends (A, B) of the op amp 120 are connected to two ends of the sensing resistor ($R_{sense}$) via a second resistor ($R_2$) and a third resistor ($R_3$) for detecting the voltage difference between two ends of the op amp 120. In the IC manufacturing process, if photolithography process is not controlled well, the input of the operational amplifier 120 would cause a mismatch to produce an offset voltage ($V_{os}$) and the voltage is equal to the abnormal offset voltage ($V_{os}$). In this case, the offset voltage correction unit 14 is used to correct the abnormal offset voltage ($V_{os}$). The offset voltage correction unit 14 in the present invention has a power activating delay circuit 141, a comparator 142 and a logic control circuit 143. The negative input end of the comparator 142 is connected to a reference voltage signal ($V_{ref}$), and the positive input end thereof is connected to the output voltage signal ($V_{out}$) generated by the arithmetic processing unit 12 so as to form a feedback circuit for comparing the reference voltage signal ($V_{ref}$) and the output voltage signal ($V_{out}$) to determine the abnormal offset voltage is a positive offset voltage ($V_{os+}$) or a negative offset voltage ($V_{os-}$). Thereafter, the output end of comparator 142 outputs a control signal (COS) to the logic control circuit 143. Moreover, the power activating delay circuit 141 is connected to a counter 1411. In the embodiment of the present invention, the counter 1411 can be disposed inside or outside the offset voltage correction unit 14. In a preferred embodiment, the counter 1411 is disposed inside the offset voltage correction unit 14 in the present invention. The power activating delay circuit 141 counts a predetermined delay time in accordance with the internal counter 1411, and an activating signal ($P_{on}\_D$) is generated to trigger the logic control circuit 143. Next, the control logic circuit 143 is activated until the operation of the control logic circuit 143 is completed, and the control logic circuit 143 will generate an enable signal (CE) according to the control signal (COS) of the comparator 142. When the enable signal (CE) is a low voltage level (L), the arithmetic processing unit 12 is triggered to perform a corrective action, and first set control switch signals (Con_TU1, Con_TU2, Con_TU3, Con_TU4, Con_TU5) generated by the logic control circuit 143 and second set control switch signals (Con_$SW_A$, Con_$SW_B$) feed back to the switching module 121 of the operational amplifier 120 of the arithmetic processing unit 12. The switching module 121 receives the first set control switch signals (Con_TU1, Con_TU2, Con_TU3, Con_TU4, Con_TU5) to turn on a plurality sets of current control switches, and a converting value corresponding to the current control switches is calculated to obtain a control current, and receives the second set control switch signals (Con_$SW_A$, Con_$SW_B$) to alternatively select a first current flow control switch ($SW_A$) or a second current flow control switch ($SW_B$) (not shown in FIG. 1), which are connected to the current control switches. According to the selection between the first current flow control switch ($SW_A$) and the second current flow control switch ($SW_B$), a corresponding control current is output to correct the abnormal positive offset voltage ($V_{os+}$) or the abnormal negative offset voltage ($V_{os-}$) generated by the op amp 120. Then, an output current is generated and outputted to the conversion circuit 122 to generate an output voltage signal ($V_{out}$). At this point, the output voltage signal further ($V_{out}$) fed back to the comparator 142 to determine the correction amount for the positive offset voltage ($V_{os+}$) or the negative offset voltage ($V_{os-}$) is enough or not. If the correction amount is not enough and the abnormal positive offset voltage ($V_{os+}$) or the abnormal negative offset voltage ($V_{os-}$) is still existed, the comparator 142 will continue to output the control signal (COS) to drive the control logic circuit 143 to generate the control switch signals (Con_TU1, Con_TU2, Con_TU3, Con_TU4, Con_TU5, Con_SW$_A$, Con_SW$_B$) fed back to the op amp of the arithmetic processing unit 12. At this point, the level of the enable signal (CE) will remain at the low voltage level (L), the abnormal amount of positive offset voltage ($V_{os+}$) or negative offset voltage ($V_{os-}$) generated by the op amp 120 will be calibrated to zero continuously. The factors of the process defects or the physical characteristics of the semiconductors resulted in the impact of the input offset voltage of the op amp can be resolved by the above-mentioned manner. The wireless charging module 3 can sense the external electronic device by the output sensing coil 32, so that the output control unit 30 can accurately read the current value for charging the electronic device 4. A good output performance and better stability of the system can be achieved. It should be noted that the external electronic device 4 described in the present invention can be 3C electronic products, such as mobile devices, tablet, or wireless charges for any other house electronic devices, and it is not limited herein.

In the present embodiment, the arithmetic processing unit 12 includes an operational amplifier (op amp) 120, and the op amp 120 includes a positive input end A, a negative input end B and an output end C. The positive input end A receives a reference voltage signal ($V_{ref}$) via a first resistor ($R_1$) and is connected to one end of a sense resistor ($R_{sense}$) via a second resistor ($R_2$). The negative input end B is connected to the other end of the sense resistor ($R_{sense}$) via a third resistor ($R_3$). The output end C is connected to the negative input end B via a fourth resistor ($R_4$). Accordingly, a feedback circuit is formed. It should be noted that the resistant value of the second resistor ($R_2$) is equal to the resistant value of the third resistor ($R_3$) and the resistant value of the first resistor ($R_1$) is equal to the resistant value of the fourth resistor ($R_4$). Also, the resistant properties of the aforementioned resistors are the same.

Figure 3:
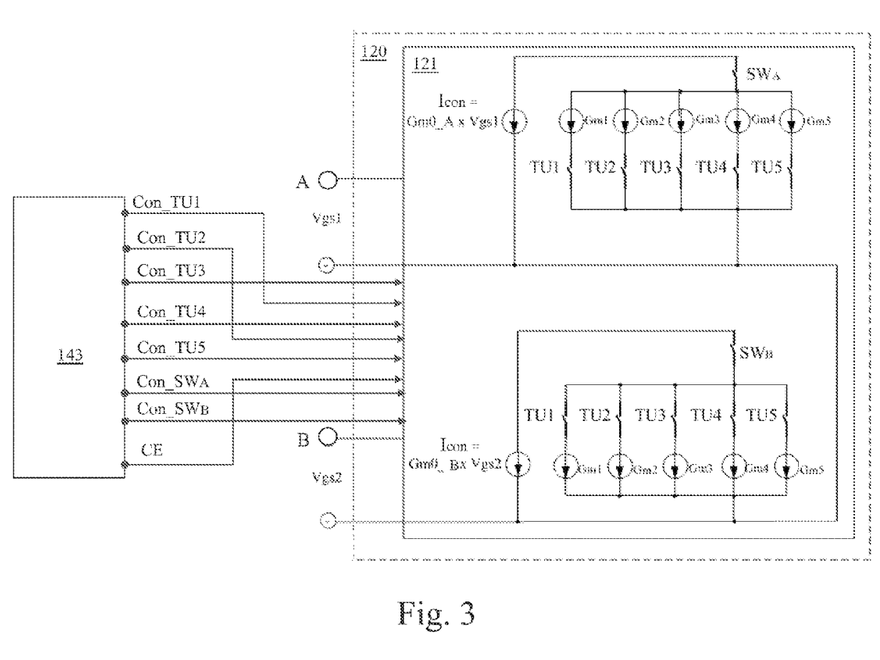
FIG. 3 is an internal block diagram illustrating a switching module in the present invention.

Now, please refer to FIG. 3, it is an internal block diagram of the switching module in the present invention. As shown in FIG. 3, one end of the switching module 121 is connected to the positive input end A and the negative input end B of the op amp 120 and configured to receive the first sensing voltage signal (S1), the second sensing voltage signal (S2) and the reference voltage signal ($V_{ref}$). The other end thereof is connected to the logic control circuit 143 and the logic control circuit is configured to receive the control signal (COS) outputted by the comparator 142. The power activating delay circuit 141 counts a predetermined delay time in accordance with the internal counter 1411 to generate the activating signal ($P_{on}$_D), and then logic control circuit 143 generates the enable signal (CE) according to the control signal (COS) of the comparator 142. When the enable signal (CE) is a low voltage level (L), the arithmetic processing unit 12 is triggered to perform a corrective action, and first set control switch signals (Con_TU1, Con_TU2, Con_TU3, Con_TU4, Con_TU5) generated by the logic control circuit 143 and second set control switch signals (Con_SW$_A$, Con_SW$_B$) feed back to the switching module 121 of the operational amplifier 120 of the arithmetic processing unit 12. The switching module 121 receives the first set control switch signals (Con_TU1, Con_TU2, Con_TU3, Con_TU4, Con_TU5) to turn on a plurality sets of current control switches (TU1, TU2, TU3, TU4, TU5) to a trans-conductance values (Gm1, Gm2, Gm3, Gm4, Gm5) respectively. The trans-conductance values are added together and parallel to the trans-conductance value of the input end of the op amp (Gm0_A & Gm0_B). The final value is called summing trans-conductance. At this point, the voltage difference (Vgs1 or Vgs2) of each end (A or B) of the arithmetic processing unit 12 is multiplied by the summing trans-conductance respectively can obtain the control current (Icon). The voltage difference value between Vgs1 and Vgs2 represent the aforementioned abnormal offset voltage ($V_{os}$). According to the second set control switch signals (Con_SW$_A$, Con_SW$_B$), the first current flow control switch (SW$_A$) or the second current flow control switch (SW$_B$) is selected to activate. The corresponding control current (Icon) is outputted to correct the abnormal positive offset voltage ($V_{os+}$) or the abnormal negative off set voltage ($V_{os-}$).

Figure 4:
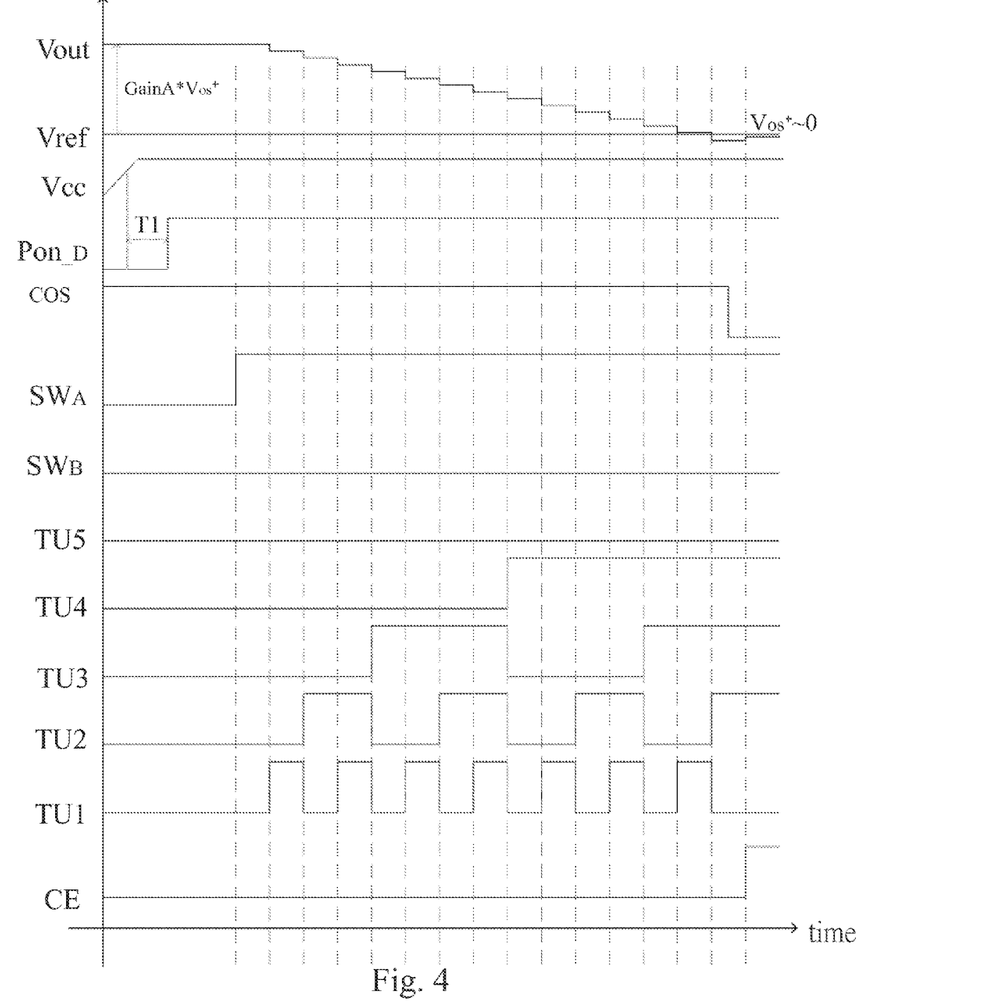
FIG. 4 is a correction motion view of a positive offset voltage in the present invention.

Please refer to FIG. 4, it is a correction timing chart of the positive offset voltage in the present invention. As shown in FIG. 4, when the power is turned on, since the rise time in each of the external power supply voltage is not the same, in order to avoid the malfunction of the logic control circuit due to the power of the signal voltage ($V_{cc}$) is not stable. When the power is turned on, the power activating delay circuit count to the predetermined delay time (T1) based on the counter. Thereafter, the activating signal ($P_{on}$_D) is converted from the low voltage level to the high voltage level. It indicates that the signal voltage ($V_{cc}$) of the power is to stable, and the logic control circuit is notified to start the action. At this point, the logic control circuit will complete the correction during correction time period. Therefore, from the time when the power is turned on to the time when the logic control circuit completes the action, the enable signal (CE) will remain at the low voltage level, which aims to close the output control unit (30) to avoid the voltage generated by the sense resistor accumulated in the offset value so as to impact the accuracy of the correction of the logic control circuit. According to the aforementioned description, when the power is turned on, the power activating delay circuit preset the delay time according to the internal counter, and the activating signal ($P_{on}$_D) will change from the low voltage level to be the high voltage level so as to notify the logic control circuit to start the action. After the comparator provides a control signal (COS) to the logic control circuit, the control signal (COS) is held at the high voltage level which is indicated that the offset voltage ($V_{os}$) belongs to the positive offset voltage ($V_{os+}$). And the voltage difference between $V_{out}$ of the op amp and the reference voltage signal $V_{ref}$ is stand for the product of the gain factor and the positive offset voltage (i.e. $V_{out} - V_{ref}$ = GainA*$V_{os+}$, where GainA=$R_4/R_3$=$R_1/R_2$). In this case, the logic control circuit performs the correction according to the output control signal (COS) of the comparator. The internal current control switch (TU1, TU2, TU3, TU4, TU5) of the internal switching module is turned on in accordance with the first set control switch signal (Con_TU1, Con_TU2, Con_TU3, Con_TU4, Con_TU5) to input the corresponding trans-conductance value (Gm1, Gm2, Gm3, Gm4, Gm5). The summing trans-conductance value is calculated in accordance with the voltage difference at two ends of the op amp input to acquire a control current (Icon). The corresponding switching timing chart of current control switch (TU1, TU2, TU3, TU4, TU5) is the waveforms (TU1, TU2, TU3, TU4, TU5) shown in FIG. 4. The summing trans-conductance in the present embodiment is Gm0+(Gm1*TU1+Gm2*TU2+Gm3*TU3+Gm4*TU4+Gm5*TU5). And then, by the second set control switch signals (Con_SW$_A$, Con_SW$_B$), the current flow control switch (SW$_A$) or the second current flow control switch (SW$_B$), which is connected to the current control switch (TU1, TU2, TU3, TU4, TU5), is selected to output the control current Icon=Vgs*(Gm0+(Gm1*TU1+Gm2*TU2+Gm3*TU3+Gm4*TU4+Gm5*TU5)) as so to correct the abnormal positive offset voltage (V$_{os+}$). Therefore, an output current is transmitted to the conversion circuit to convert to output a voltage signal (V$_{out}$). At this point, the output voltage signal further (V$_{out}$) fed back to the comparator to determine the correction amount for the positive offset voltage (V$_{os+}$) is enough or not. If the correction amount is not enough and there is still unusual amount of the positive offset voltage (V$_{os+}$), the comparator will continue to output the control signal (COS) to drive the logic control circuit to generate the first set control switch signal (Con_TU1, Con_TU2, Con_TU3, Con_TU4, Con_TU5) fed back to the op amp of the arithmetic processing unit. The op amp resets the abnormal positive offset voltage (V$_{os+}$) periodically to zero (V$_{os+}$~0), i.e. the correction quantity of the positive offset voltage (V$_{os+}$) of the op amp at each cycle T (T=16 μs) is about 0.10 mv. When the auto-correction circuit completes the correction performance, the current control switches (TU1, TU2, TU3, TU4, TU5) will maintain at the last voltage level to continue providing the control current (Icon) to the op amp. When the correction quantity is arrived, the control signal (COS) will be from the high voltage level (H) to be the low voltage level (L) and the logic control circuit will further add a least significant bit (Least Significant Bit, LSB, i.e. 0.05 millivolts (mV)) of the compensative value to further reduce the error. When the correction of the logic control circuit is finished, the enable signal (CE) will be from the low voltage level to be the high voltage level. Until the next power-up, the logic control circuit will reset and re-correct the abnormal offset voltage (V$_{os}$) to zero.

Figure 5:
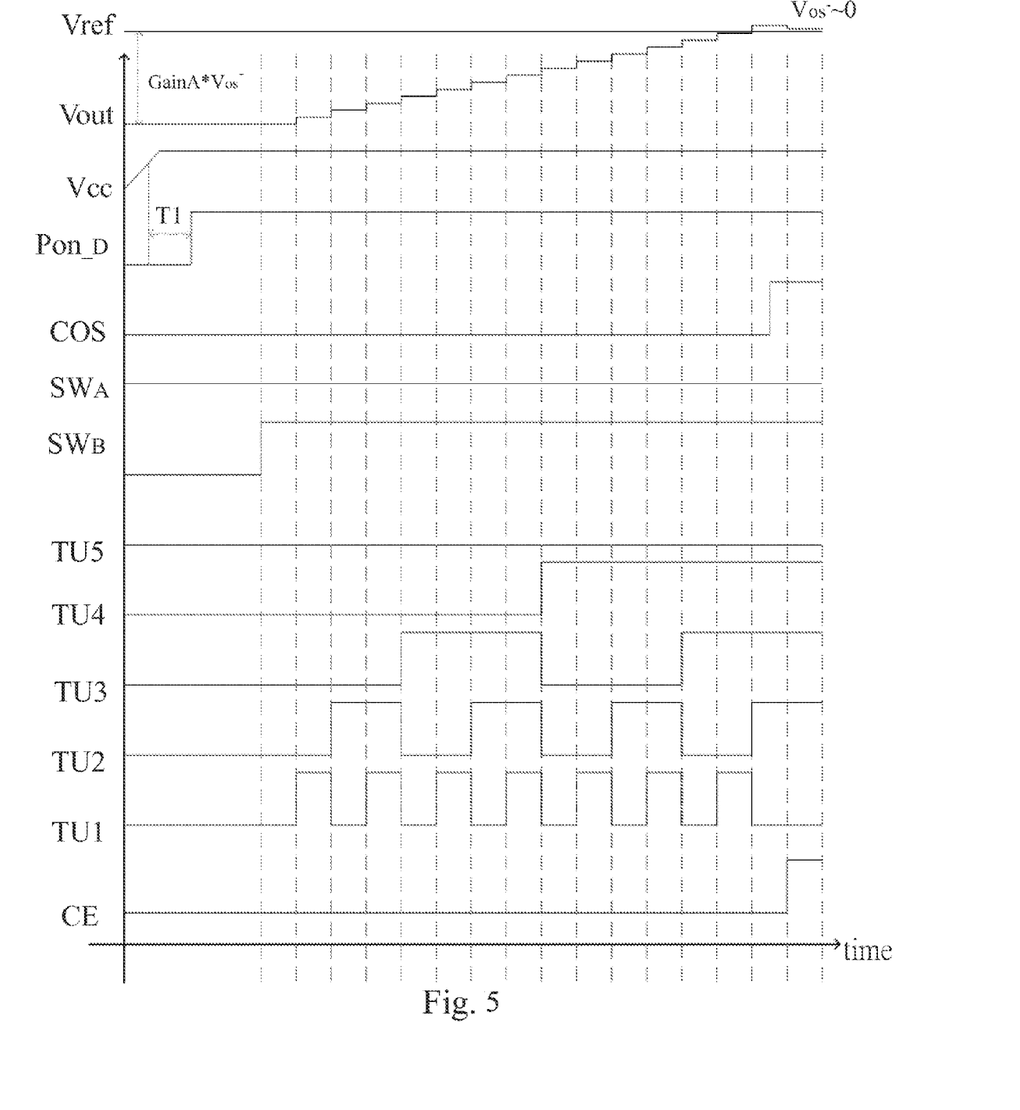
FIG. 5 is a correction motion view of a negative offset voltage in the present invention.

Please refer to FIG. 5, it is a correction timing chart of the negative offset voltage in the present invention. As shown in FIG. 5, when the power is turned on, the power activating delay circuit counts to the predetermined delay time (T1) based on the internal counter, the activating signal (P$_{on\_D}$) is changed from the low voltage level to be the high voltage level and the logic control circuit is notified to start the action. The comparator will provide the control signal to the logic control circuit and the control signal (COS) will keep in the low voltage level. The different from FIG. 4 is that the control signal (COS) of the comparator will determine the offset voltage (V$_{os}$) belonging to the negative offset voltage (V$_{os-}$). And the voltage difference between the reference voltage V$_{ref}$ and V$_{out}$ of op amp is stand for the product of the gain factor and the negative offset voltage (i.e. V$_{ref}$-V$_{out}$=GainA*V$_{os-}$, where GainA=R$_4$/R$_3$=R$_1$/R$_2$). In this case, the logic control circuit performs the correction according to the output control signal (COS) of the comparator. The internal current control switch (TU1, TU2, TU3, TU4, TU5) of the internal switching module is turned on in accordance with the first set control switch signal (Con_TU1, Con_TU2, Con_TU3, Con_TU4, Con_TU5) to input the corresponding trans-conductance value (Gm1, Gm2, Gm3, Gm4, Gm5). The summing trans-conductance value is calculated in accordance with the voltage difference at two ends of the op amp input to acquire a control current (Icon). The corresponding switching timing chart of current control switch (TU1, TU2, TU3, TU4, TU5) is the waveforms (TU1, TU2, TU3, TU4, TU5) shown in FIG. 5. The summing trans-conductance in the present embodiment is Gm0+(Gm1*TU1+Gm2*TU2+Gm3*TU3+Gm4*TU4+Gm5*TU5). And then, by the second set control switch signals (Con_SW$_A$, Con_SW$_B$), the current flow control switch (SW$_A$) or the second current flow control switch (SW$_B$), which is connected to the current control switch (TU1, TU2, TU3, TU4, TU5), is selected to output the control current Icon=Vgs*(Gm0+(Gm1*TU1+Gm2*TU2+Gm3*TU3+Gm4*TU4+Gm5*TU5)) as so to correct the abnormal negative offset voltage (V$_{os-}$). Therefore, an output current is transmitted to the conversion circuit, and is converted to output a voltage signal (V$_{out}$). At this point, the output voltage signal (V$_{out}$) further fed back to the comparator to determine the correction amount for the negative offset voltage (V$_{os-}$) is enough or not. If the correction amount is not enough and there is still unusual amount of the negative offset voltage (V$_{os-}$), the comparator will continue to output the control signal (COS) to drive the logic control circuit to generate the first set control switch signal (Con_TU1, Con_TU2, Con_TU3, Con_TU4, Con_TU5) fed back to the op amp of the arithmetic processing unit. The op amp resets the abnormal negative offset voltage (V$_{os-}$) periodically to zero (V$_{os-}$~0), i.e. the correction quantity of the negative offset voltage (V$_{os-}$) of the op amp at each cycle T (T=16 μs) is about 0.10 mv. When the auto-correction circuit completes the correction performance, the current control switches (TU1, TU2, TU3, TU4, TU5) will maintain at the last voltage level to continue providing the control current (Icon) to the op amp. When the correction quantity is arrived, the control signal (COS) will be from the low voltage level (L) to be the high voltage level (H) and the logic control circuit will further add a least significant bit (Least Significant Bit, LSB, i.e. 0.05 millivolts (mV)) of the compensative value to further reduce the error. When the correction of the logic control circuit is finished, the enable signal (CE) will be from the low voltage level to be the high voltage level. Until the next power-up, the logic control circuit will reset and re-correct the abnormal offset voltage (V$_{os}$) to zero.

Accordingly, the wireless charger driving system in the present invention can efficiently solve the effect of the offset voltage of the op amp caused by the process error or the physical properties of the semiconductor. The wireless charging module can sense the external electronic device by the output sensing coil and let the output control unit able to read the current precisely so as to charge the external electronic device. Therefore, good output performance and better system stability can be achieved.

As described above, the present invention has been described with preferred embodiments thereof and it is understood that many changes and modifications to the described embodiments can be carried out without departing from the scope and the spirit of the invention that is intended to be limited only by the appended claims.

What is claimed is:

1. A driving device with correction function, one end thereof connected to a power supply unit and the other end thereof connected to a ground load, and the ground load activated by the power supply unit, and the driving device comprising:
 an arithmetic processing unit including a first end, a second end and a third end, and the first end and the second end are connected to a sensing resistor between the power supply unit and the ground load, and a voltage different signal is detected at two ends of the sensing resistor, and the third end signal is output a voltage signal; and an offset voltage correction unit electrically connected to the arithmetic processing unit to correct an offset voltage generated by the arithmetic processing unit, and the offset voltage correction unit including a power activating delay circuit, a comparator and a logic control circuit, wherein a negative input end of the comparator is connected to a reference voltage signal and a positive input end thereof is connected to the output voltage signal of the arithmetic processing unit to form a feedback circuit, the offset voltage is compared to determine to be a positive offset voltage or a negative offset voltage so as to output a control signal to the logic control circuit, when the power is turned on, the power activating delay circuit counts to a predetermined delay time to generate an activating signal to the logic control circuit and the logic control circuit generates an activating signal to trigger the arithmetic processing unit to perform an action, so as to reset the positive voltage or the negative voltage to zero.

2. The driving device according to claim 1, wherein the predetermined delay time is based on a counter.

3. The driving device according to claim 1, wherein the arithmetic processing unit further comprises an operational amplifier (op amp) having a positive input end, a negative input end and an output end, wherein the positive input end receives the reference voltage signals via a first resistor, and connected to the one end of the sense resistor by a second resistor, the negative input end is connected to the other end of the sensing resistor via a third resistor, and the output end is connected to the negative input end via a fourth resistor.

4. The driving device according to claim 3, wherein the internal op amp further comprises:

a switching module, and one end thereof is connected to the positive input end and the negative input end of the op amp to receive a first sensing voltage signal, a second sensing voltage signal and the reference voltage signal, and the other end thereof is connected to the logic control circuit to receive a first set control switch signals to turn on current control switches and transmit a trans-conductance value corresponding to one of the current control switches to obtain a control current by calculating and receive a second set control switch signal to optionally turn on a first current flow control switch or a second current flow control switch, which is connected to the current control switches, by the chosen first current flow control switch or the second current flow control switch, the corresponding control current is outputted to perform the correction for the positive offset voltage or the negative voltage so as to generate a output current; and an conversion circuit coupled to the switching module, and the conversion circuit converts to generate an output voltage signal according to the current output from the switching module.

5. The driving device according to claim 1, wherein the ground load is a wireless charging module.

6. A driving device with correction function, one end thereof connected to a power supply unit and the other end thereof connected to a ground load, and the ground load activated by the power supply unit, and the driving device comprising:

an arithmetic processing unit including a first end, a second end and a third end, and the first end and the second end are connected to a sensing resistor between the power supply unit and the ground load, and a voltage different signal is detected at two ends of the sensing resistor to acquire a first sensing voltage signal and a second sensing voltage signal, and the third end signal is represent to an output voltage signal calculated from the first sensing voltage signal, the second voltage signal and a reference voltage signal; and an offset voltage correction unit electrically connected to the arithmetic processing unit to correct an offset voltage generated by the arithmetic processing unit, and the offset voltage correction unit including a power activating delay circuit, a comparator and a logic control circuit, wherein a negative input end of the comparator is connected to the reference voltage signal and a positive input end thereof is connected to the output voltage signal of the arithmetic processing unit to form a feedback circuit, the offset voltage is compared to determine to be a positive offset voltage or a negative offset voltage so as to output a control signal to the logic control circuit, when the power is turned on, the power activating delay circuit counts to a predetermined delay time to generate an activating signal to the logic control circuit and the logic control circuit generates an activating signal to trigger the arithmetic processing unit to perform an action, and a first set control switch signal and a second set control switch signal are generated by the logic control circuit fed back to the arithmetic processing unit so as to reset the positive voltage or the negative voltage to zero.

7. The driving device according to claim 6, wherein the predetermined delay time is based on a counter.

8. The driving device according to claim 6, wherein the arithmetic processing unit further comprises an operational amplifier (op amp) having a positive input end, a negative input end and an output end, wherein the positive input end receives the reference voltage signals via a first resistor, and connected to the one end of the sense resistor by a second resistor, the negative input end is connected to the other end of the sensing resistor via a third resistor, and the output end is connected to the negative input end via a fourth resistor.

9. The driving device according to claim 8, wherein the internal op amp further comprises:

a switching module, and one end thereof is connected to the positive input end and the negative input end of the op amp to receive the first sensing voltage signal, the second sensing voltage signal and the reference voltage signal, and the other end thereof is connected to the logic control circuit to receive the first set control switch signals to turn on current control switches and transmit a trans-conductance value corresponding to one of the current control switches to obtain a control current by calculating and receive the second set control switch signal to optionally turn on a first current flow control switch or a second current flow control switch, which is connected to the current control switches, by the chosen first current flow control switch or the second current flow control switch, the corresponding control current is outputted to perform the correction for the positive offset voltage or the negative voltage so as to generate a output current; and an conversion circuit coupled to the switching module, and the conversion circuit converts to generate an output voltage signal according to the current output from the switching module.

10. The driving device according to claim 6, wherein the ground load is a wireless charging module.

11. A wireless charger driving system includes a driving device with correction function and a wireless charging module, and one end of the driving device is connected to a power supply and the other end is connected to a wireless charging module, and the wireless charging module activated by the power supply unit, and the driving device comprising:
   an arithmetic processing unit including a first end, a second end and a third end, and the first end and the second end are connected to a sensing resistor between the power supply unit and the wireless charging module, and a voltage different signal is detected at two ends of the sensing resistor to acquire a first sensing voltage signal and a second sensing voltage signal, and the third end signal is output a voltage signal calculated from the first sensing voltage signal, the second voltage signal and a reference voltage signal; and
   an offset voltage correction unit electrically connected to the arithmetic processing unit to correct an offset voltage generated by the arithmetic processing unit, and the offset voltage correction unit including a power activating delay circuit, a comparator and a logic control circuit, wherein a negative input end of the comparator is connected to the reference voltage signal and a positive input end thereof is connected to the output voltage signal of the arithmetic processing unit to form a feedback circuit, the offset voltage is compared to determine to be a positive offset voltage or a negative offset voltage so as to output a control signal to the logic control circuit, when the power is turned on, the power activating delay circuit counts to a predetermined delay time to generate an activating signal to the logic control circuit and the logic control circuit generates an enable signal to trigger the arithmetic processing unit to perform an action, so as to reset the positive voltage or the negative voltage to zero.

12. The wireless charger driving system according to claim 11, wherein the predetermined delay time is based on a counter.

13. The wireless charger driving system according to claim 11, wherein the wireless charging module includes an output control unit and the output control unit is connected to an output sensing coil.

14. The wireless charger driving system according to claim 13, wherein the wireless charging module senses an external electronic device by the output sensing coil and the output control unit controls the external electronic device to perform charging.

15. The wireless charger driving system according to claim 11, wherein the arithmetic processing unit further includes an op amp having a positive input end, a negative input end and an output end, wherein the positive input end receives the reference voltage signals via a first resistor, and connected to the one end of the sense resistor by a second resistor, the negative input end is connected to the other end of the sensing resistor via a third resistor, and the output end is connected to the negative input end via a fourth resistor.

16. The wireless charger driving system according to claim 15, wherein the internal op amp further comprises:
   a switching module, and one end thereof is connected to the positive input end and the negative input end of the op amp to receive the first sensing voltage signal, the second sensing voltage signal and the reference voltage signal, and the other end thereof is connected to the logic control circuit to receive a first set control switch signals to turn on current control switches and transmit a trans-conductance value corresponding to one of the current control switches to obtain a control current by calculating and receive a second set control switch signal to optionally turn on a first current flow control switch or a second current flow control switch, which is connected to the current control switches, by the chosen first current flow control switch or the second current flow control switch, the corresponding control current is outputted to perform the correction for the positive offset voltage or the negative voltage so as to generate a output current; and
   an conversion circuit coupled to the switching module, and the conversion circuit converts to generate an output voltage signal according to the current output from the switching module.

* * * * *